(12) United States Patent
Yoshida et al.

(10) Patent No.: US 7,976,952 B2
(45) Date of Patent: Jul. 12, 2011

(54) MULTILAYER SHEET, PRODUCTION METHOD THEREOF AND PRESSURE-SENSITIVE ADHESIVE SHEET USING THE MULTILAYER SHEET

(75) Inventors: Yoshinori Yoshida, Osaka (JP); Kouji Akazawa, Osaka (JP); Tomohiro Kontani, Osaka (JP); Kohei Yano, Osaka (JP)

(73) Assignee: Nitto Denko Corporation, Osaka (JP)

( * ) Notice: Subject to any disclaimer, the term of this patent is extended or adjusted under 35 U.S.C. 154(b) by 1514 days.

(21) Appl. No.: 11/358,886

(22) Filed: Feb. 21, 2006

(65) Prior Publication Data

US 2006/0188725 A1  Aug. 24, 2006

(30) Foreign Application Priority Data

Feb. 23, 2005 (JP) ................................. 2005-047504
Aug. 11, 2005 (JP) ................................. 2005-233266

(51) Int. Cl.
*B32B 27/32* (2006.01)
*B32B 27/36* (2006.01)
*B32B 27/40* (2006.01)

(52) U.S. Cl. .................... 428/423.7; 428/424.2
(58) Field of Classification Search ............... 428/423.1, 428/423.7, 424.2

See application file for complete search history.

(56) References Cited

U.S. PATENT DOCUMENTS

| 4,587,201 | A | 5/1986 | Morikawa et al. |
| 5,672,653 | A | 9/1997 | Frisch et al. |
| 6,566,024 | B1 * | 5/2003 | Bourdelais et al. ............. 430/11 |
| 2004/0126575 | A1 * | 7/2004 | Yoshida et al. ............... 428/343 |

FOREIGN PATENT DOCUMENTS

| JP | 61-10242 A | 1/1986 |
| JP | 61-260629 A | 11/1986 |
| JP | 9-253964 A | 9/1997 |
| JP | 10-053636 A | 2/1998 |
| JP | 2000-38556 A | 2/2000 |
| JP | 2000-150432 A | 5/2000 |
| JP | 2002-69396 A | 3/2002 |
| JP | 2002322454 | * 11/2002 |
| JP | 2003-82307 A | 3/2003 |
| JP | 2004-107644 A | 4/2004 |
| JP | 2004-122758 A | 4/2004 |

OTHER PUBLICATIONS

Japanese Office Action dated Apr. 27, 2010.

* cited by examiner

*Primary Examiner* — Thao T. Tran
(74) *Attorney, Agent, or Firm* — Sughrue Mion, PLLC

(57) ABSTRACT

To provide a pressure-sensitive adhesive sheet used during processing articles such as semiconductor wafers and laminate sheet used for such a pressure-sensitive adhesive sheet, which does not contaminate or break the semiconductor wafers during the processing and can minimize the curl of the articles due to residual stress of the pressure-sensitive adhesive sheet, a multi-layer sheet includes a composite film containing a urethane polymer and a vinyl-based polymer as effective components and a first film made of a material different from that of the composite film, wherein the urethane polymer is formed from a polyolefin diol and a polyisocyanate. A pressure-sensitive adhesive sheet is obtained by providing a pressure-sensitive adhesive layer on at least one side of the multi-layer sheet.

14 Claims, 1 Drawing Sheet

MULTILAYER SHEET, PRODUCTION METHOD THEREOF AND PRESSURE-SENSITIVE ADHESIVE SHEET USING THE MULTILAYER SHEET

BACKGROUND OF THE INVENTION

1. Field of the Invention

The present invention relates to a multilayer sheet, a pressure-sensitive adhesive sheet, a method for producing a multilayer sheet, and a method for processing articles using such pressure-sensitive adhesive sheet. In particular, the present invention relates to a pressure-sensitive adhesive sheet used in a process of high-precision processing of semiconductor products such as semiconductor wafers and optical products in order to hold or protect such products, to a multilayer sheet used as a base material thereof and a method for producing the same as well as to a method for producing an article using such a pressure-sensitive adhesive sheet.

2. Description of Related Art

In some industrial fields such as optical industries and semiconductor industries, pressure-sensitive adhesive sheets are used in high-precision processing optical parts such as lenses or semiconductor articles such as semiconductor wafers in order to protect the surface of wafers and the like or prevent breakage thereof.

For example, in the process of producing semiconductor chips, the semiconductor chips are produced as follows. First a high-purity silicon single crystal or the like is sliced to form wafers. A predetermined circuit pattern such as IC and the like is formed on the wafer by etching to incorporate an integrated circuit. Then, the back side of the wafer is ground by a grinding machine to a thickness as thin as about 100 to about 600 μm, in some cases to a thickness of 100 μm or less. Finally, the wafer is diced into chips. Since the semiconductor wafer in itself is thin and brittle and the circuit pattern is uneven, the wafer tends to be broken if external force is applied to the wafer when it is transported to the steps of grinding and dicing. In the step of grinding processing, grinding is performed while washing the backside of the wafer with purified water in order to remove the resultant grinding sludge or remove heat generated during the grinding. The grinding sludge and grinding water and the like could cause environmental pollution and it is necessary to prevent such pollution. Consequently, to protect, for example, the circuit pattern surface and prevent breakage of the semiconductor wafer, it has been widely practiced to apply a pressure-sensitive adhesive sheet on the circuit pattern surface of the wafer before the operation can be performed. Further, when dicing, for example, a pressure-sensitive adhesive sheet is applied to the back side of the wafer and the wafer is diced in a glued and fixed state to form a chip. Then, the chip is raised by picking the base material side with a needle and the raised chip is transferred and fixed onto a die pad.

Examples of known pressure-sensitive adhesive sheet used herein include pressure-sensitive adhesive sheets that include a base material sheet made of, for example, polyethylene terephthalate (PET), polyethylene (PE), polypropylene (PP), or ethylene/vinyl acetate (EVA), having thereon a pressure-sensitive adhesive layer. Japanese Patent Application Laid-open No. 61-10242 discloses a film for use in processing silicon wafers including a base material sheet with a Shore Hardness D of 40 or less having provided on a surface thereof a pressure-sensitive adhesive layer. Further, Japanese Patent Application Laid-open No. 9-253964 discloses a pressure-sensitive adhesive tape that includes a base material made of a radiation-cured composition containing a urethane acrylate-based oligomer and a reactive dilution monomer having provided thereon a pressure-sensitive adhesive layer. Japanese Patent Application Laid-open No. 61-260629 discloses a film for use in processing silicon wafers that includes a base material film with a Shore Hardness D of 40 or less having laminated an auxiliary film with a Shore Hardness D of more than 40 on one surface thereof and a pressure-sensitive adhesive layer on another surface thereof. Japanese Patent Application Laid-open No. 2002-69396 discloses a pressure-sensitive adhesive film for protecting semiconductor wafers, which includes at least three base material films: a low elastic modulus film with a storage elastic modulus (E') of $1\times10^5$ to $1\times10^8$ Pa and a thickness of 10 to 150 μm as an outermost layer and a high elastic modulus film with a storage elastic modulus (E') of $2\times10^8$ to $1\times10^{10}$ Pa and a thickness of 10 to 150 μm as an innermost layer. Japanese Patent Application Laid-open No. 2000-38556 discloses a sheet for protecting semiconductor wafers, which has a hot-melt adhesive layer having a melting point of 105° C. or less. Japanese Patent Application Laid-open No. 2000-150432 discloses a pressure-sensitive adhesive sheet having a stress relaxation rate of 40%/minute or more at 10% elongation in a tensile test.

However, in recent years, differences in height of unevenness on the surface of circuit patterns is increasing and along with miniaturization of chips, semiconductor wafers with a reduced thickness as thin as 100 μm or less are being demanded. For example, a pressure-sensitive adhesive sheet using a rigid base material such as one made of PET is prevented from curling of wafers after they are made thin and polished while the pressure-sensitive adhesive sheet can not follow the unevenness on the circuit pattern on the surface of the wafer, so that the adhesion between the pressure-sensitive adhesive layer and the pattern surface becomes insufficient. This results in peeling of the sheet or penetration of polishing water or foreign matter into the pattern surface. Further, pressure-sensitive adhesive sheets made of a flexible base material such as one made of EVA has no problem with respect to the followability to the pattern surface but because of insufficient rigidity of the base material, such pressure-sensitive adhesive sheets undergo curls that occur after the wafers are polished or deflection due to the self-weight of the wafers. From this, one might consider to use a composite base material obtainable by affixing a PET base material having rigidity and an EVA base material being flexible to each other. However, when the two base materials are mechanically affixed to each other with an adhesive, stress applied when the base materials are affixed to each other remains in the resultant film so that the obtained composite base material will curl. On the other hand, when a laminate is formed from such base materials by a T-die method or by a calendering method, it is difficult to provide a thick film. As a result, films, which are thin, tend to undergo heat shrinking during their film forming process so that residual stress will occur in the films. A pressure-sensitive adhesive sheet produced by using such base materials with residual stress has defects that the wafer is damaged while the wafer is being polished or the wafer curls after its polishing. Furthermore, when a laminate is formed by a solution coating method, use of solvents causes environmental problem as well as it is necessary to repeat coating when a thick film is to be prepared.

Japanese Patent Application Laid-open Nos. 2004-107644 and 2004-122758 disclose pressure-sensitive adhesive sheets that include a composite film containing a urethane polymer and a vinyl-based polymer as major components as an intermediate layer and teach that such pressure-sensitive adhesive sheets are effective in coping with the above-mentioned problems.

A wafer is passed through a dicing step where the wafer is cut into individual chips and the chips are subjected to wire bonding, sealing with a resin and so on. A pressure-sensitive adhesive sheet used in these steps must not contaminate an adherend such as a wafer by an organic substance derived from the pressure-sensitive adhesive or particles a and so on that constitute the pressure-sensitive adhesive layer. However, the above-mentioned pressure-sensitive adhesive sheets are not free of the problem of contamination.

It is known that the contamination on the surface of a wafer gives an adverse influence on the shear strength of wire bonding. That is, in the wire bonding carried out when semiconductor chips are produced, the adhesion strength between a ball and a pad is required to be high, generally organic substances or particles attached on the surface of wafers are factors that prevent a gold wire from bonding to the surface of aluminum. When organic substance or particles that are attached in large amounts on the surface of aluminum, such contamination causes various problems. For example, it serves as a starting point for the formation of voids, with the result that the sealant resin is peeled off from the wafer, cracks occur in the sealant resin, or the shear strength of wire bonding is decreased.

Conventionally, solvent-type acrylic pressure-sensitive adhesives have been used as pressure-sensitive adhesives. Since the solvent-type acrylic pressure-sensitive adhesives are synthesized in organic solvents, use of the pressure-sensitive adhesives causes environmental problem due to the volatilization of the solvent upon coating. For this reason, aqueous dispersion-type acrylic pressure-sensitive adhesives are being increasingly used in place of the solvent-type pressure-sensitive adhesives. However, the aqueous dispersion-type pressure-sensitive adhesives use emulsifiers in contrast to the solvent-type acrylic pressure-sensitive adhesives so that it has been difficult to achieve a low degree of pollution by the pressure-sensitive adhesives.

In particular, along with recent trends of higher density of semiconductor integrated circuits and higher performance thereof, management of contamination onto semiconductor wafers and circuit surfaces of semiconductor chips produced therefrom is becoming severer so that it is required that pressure-sensitive adhesive sheets for use in processing wafers must have much lower contamination than ever.

The present invention has been made with a view to solving the above-mentioned problems and it is an object of the present invention to provide a pressure-sensitive adhesive sheet that is used in processing articles such as semiconductor wafers and gives no adverse effects on semiconductor wafers, for example, breakage of the wafers during polishing even when the wafers to be obtained after the polishing are thin, causes less bending of semiconductor wafers, allows the wafer to undergo less curling due to residual stress of the pressure-sensitive adhesive sheet, and assures low environmental pollution. It is another object of the present invention to provide a multilayer sheet for use as a base material for the pressure-sensitive adhesive sheet. It is still another object of the present invention to provide a method for producing such a multilayer sheet.

SUMMARY OF THE INVENTION

The multilayer sheet of the present invention is a multilayer sheet that includes a composite film containing a urethane polymer and a vinyl-based polymer as effective components and a first film made of a material that is different from that of the composite film, in which the urethane polymer is prepared from a polyolefin-based diol and a polyisocyanate.

Here, the polyolefin-based diol is preferably a hydrogenated-type polybutadienediol.

Further, the vinyl-based polymer may be an acrylic-based polymer.

The acrylic-based polymer is preferably obtained by copolymerizing a nitrogen-containing monomer.

Moreover, the vinyl-based polymer preferably contains a difunctional urethane acrylate.

Preferably, the difunctional urethane acrylate is contained in an amount of 1 part by weight or more and 50 parts by weight or less per 100 parts by weight of the vinyl-based monomer.

The composite film may be prepared by reacting a polyol with a polyisocyanate in a radical polymerizable monomer to form a urethane polymer, coating the obtained mixture of the resultant urethane polymer and the radical polymerizable monomer on a first film, and irradiating radiation to cure the coated mixture.

The radical polymerizable monomer may be an acrylic monomer.

The multilayer sheet of the present invention may be a laminate that includes the composite film having a first film made of a material different from that of the composite film on one surface of the composite film and another first film or a second film made of a material different from that of the first film on the other surface of the composite film.

In the present invention, the multilayer sheet can be provided with a further pressure-sensitive adhesive layer on at least one side thereof to form a pressure-sensitive adhesive sheet.

A method for processing the article of the present invention includes affixing the pressure-sensitive adhesive sheet to an article to be high precision-processed, and high precision-processing the article in a held and/or protected state.

A method for producing a multilayer according to the present invention includes coating a mixture containing a urethane polymer and a radical polymerizable monomer on a first film, irradiating radiation to the coated mixture to cure the mixture to form a composite film, and forming a laminate having the composite film and the first film.

Here, after the mixture is coated on the first film, a further first film or a second film may be superimposed on the coated mixture, followed by irradiating radiation above the further first film or second film to cure the mixture to form a composite film, thereby forming a laminate having the first film, the composite film, the further first film or second film.

Further, the mixture may be prepared by reacting a polyol with a polyisocyanate in a radical polymerizable monomer to form a urethane polymer.

The radical polymerizable monomer may be an acrylic-based monomer.

DETAILED DESCRIPTION

Figure 1A:
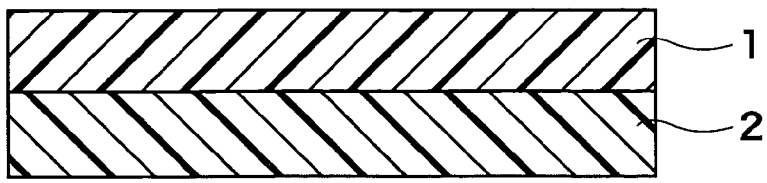
FIG. 1A is a cross-sectional view showing a layer structure of a multilayer sheet according to a first embodiment of the present invention.

The multilayer sheet of the present invention is a laminate that includes a composite film containing a urethane polymer and a vinyl-based polymer as active components and a first film made of a material different from that of the composite film. In the present invention, the term "film" as used herein also refers to a sheet and the term "sheet" as used herein also refers to a film.

The source of contamination to the surface of wafers when a pressure-sensitive adhesive sheet is used in processing the wafers is known to be low molecular weight components contained in the pressure-sensitive adhesive layer that directly contacts the surface of the wafer. It has revealed that in the case of a pressure sensitive adhesive sheet having a composite film as an intermediate layer containing a urethane polymer, the urethane polymer contained in the composite film also constitutes the source of contamination. That is, it is conceivable that the urethane polymer contained in the composite film reaches the surface of the wafer through the pressure-sensitive adhesive layer and increases the amount of contamination. Therefore, in the present invention, the urethane polymer is constituted by a polyolefin-based diol and a polyisocyanate.

Hereinafter, the present invention is described in greater detail by embodiments referring to the attached drawings. The same or like members or components are designated like reference numerals and detailed description of such members or components is omitted.

FIG. 1A is a cross-sectional view showing a layer structure of the multilayer sheet according to a first embodiment of the present invention. The multilayer sheet shown in FIG. 1A includes a first film 1 laminated on a composite film 2.

Examples of the material that can be used as the first film laminated on the composite film include polyester-based resins such as polyethylene terephthalate (PET) and polybutyleneterephthalate (PBT); polyolefin-based resins such as polyethylene (PE), polypropylene (PP), high density polyethylene, and biaxially stretched polypropylene; thermoplastic resins such as polyimides (PI), polyether ether ketone (PEEK), polyvinyl chloride (PVC), polyvinylidene chloride-based resins, polyamide-based resins, polyurethane-based resins, polystyrene-based resins, acrylic-based resins, fluorine-contained resins, cellulose-based resins, and polycarbonate-based resins; and in addition thermosetting resins. Among others, PET is preferably used since it has suitable hardness when used in processing high precision parts and further it is advantageous from the viewpoints of a variety of kinds and low price. It is preferable that the material of the film be determined appropriately depending on the kind of the pressure-sensitive adhesive layer to be provided according to the purpose and necessity. For example, when an ultraviolet ray-curing type pressure-sensitive adhesive is provided, a base material having high ultraviolet transmission is preferable.

In the first film, generally used additives may be used as necessary as far as the effects of the present invention are not deteriorated. Examples of such additives include antioxidants, fillers, pigments, colorants, flame retardants, antistatic agents, and ultraviolet absorbents.

In the present invention, conventional physical treatment or chemical treatments such as matting treatment, corona discharge treatment, primer treatment, crosslinking treatment (chemical crosslinking treatment with, for example, silane) may be applied to the surface of the first film as necessary.

Figure 1B:
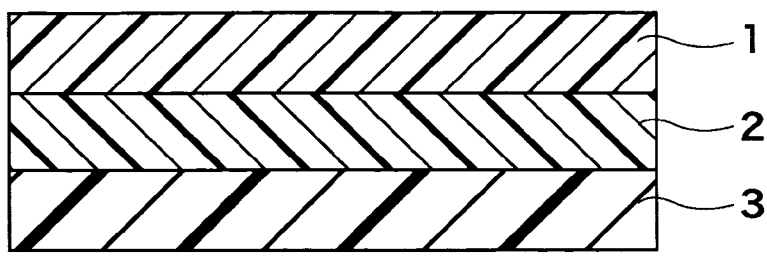
FIG. 1B is a cross-sectional view showing a layer structure of a multilayer sheet according to a second embodiment of the present invention.

In the present invention, a film may be further laminated on another side of the composite film. Such an embodiment is shown in FIG. 1B, which is a cross-sectional view showing a layer structure of the multilayer sheet according to a second embodiment of the present invention. The multilayer sheet shown in FIG. 1B is includes a first film 1 laminated on a composite film 2, the composite film 2 having laminated on another side thereof a second film 3.

The second film 3 laminated on the other side of the composite film is a film made of a different material from that of the first film. In the present invention, another first film in place of the second film in FIG. 1B may be laminated on the composite film. As the second film made of a different material from that of the first film may be used the same materials as those listed for the first film and may be selected from the above-mentioned materials as appropriate.

In the present invention, the composite film 2 can contain a urethane polymer and a vinyl-based polymer. Composite films having various properties can be obtained by appropriately selecting the composition of the urethane polymer and the kind and composition of the vinyl-based polymer, as well as the blending ratio of the urethane polymer and the vinyl-based polymer, and so on and further by combining crosslinking agents and so on as appropriate.

In the present invention, the composite film can be obtained by solution polymerization or emulsion polymerization of a vinyl-based monomer in the presence of a urethane polymer. The vinyl-based polymer that constitutes the composite film is preferably an acrylic-based polymer. In this case, the urethane-acrylic composite material can be formed by solution polymerization or the like of the acrylic-based monomer.

In the present invention, the composite film may be formed by forming a urethane polymer in a radical polymerizable monomer as a diluent, coating a mixture containing as a major component the radical polymerizable monomer and the resultant urethane polymer on the first film, and irradiating radiation onto the coated mixture to cure it. Alternatively, the composite film may be formed by coating the mixture on the first film, superimposing another first film or a second film thereon, and irradiating radiation through the additional first film or the second film to cure the coated mixture. Here, the radical polymerizable monomers that can be used include those monomers having radical polymerizable unsaturated double bonds, for example, vinyl-based monomers. From the view point of reactivity, acrylic-based monomers are preferable.

Specifically, (a) The urethane-acrylic composite material can be obtained by reacting a polyol with a diisocyanate and dissolving the reaction product in an acrylic-based monomer with adjusting the viscosity of the solution, coating the adjusted solution on a first film, and curing the coating with light from a low pressure mercury lamp or the like.

(b) The urethane-acrylic composite material can be obtained also by reacting a polyol with a diisocyanate to adjust viscosity after the polyol is dissolved in the acrylic-based monomer, coating the adjusted solution on a first film, and then curing the coating with light from a low pressure mercury lamp or the like. In this method, the acrylic-based monomer may be added during the synthesis of urethane at a time or in plural times dividedly. Further, the polyol may be reacted after the diisocyanate is dissolved in the acrylic-based monomer.

Here, according to the method (a), when the polyurethane produced by the reaction of the polyol with the diisocyanate has an increased molecular weight, it is difficult to dissolve the polyurethane in the acrylic-based monomer. Thus, the method (a) has a defect that the molecular weight of the polyurethane that can be used is inescapably limited. On the other hand, according to the method (b), the molecular weight of the polyurethane that can be used is not limited and polyurethanes having high molecular weights can be produced, so that the molecular weight of the polyurethane that is finally obtained can be designed to any desired value.

Further, the urethane-acrylic composite material can be obtained by (c) preliminarily dissolving a urethane polymer separately prepared in an acrylic-based monomer, coating the resultant solution on a first film, and curing the coating with light from a low pressure mercury lamp or the like.

Examples of the acrylic-based monomer that can be preferably used in the present invention include (meth) acrylic acid, methyl (meth)acrylate, ethyl (meth)acrylate, propyl (meth)acrylate, butyl (meth)acrylate, pentyl (meth)acrylate, hexyl (meth)acrylate, 2-ethylhexyl (meth)acrylate, octyl (meth)acrylate, isooctyl (meth)acrylate, nonyl (meth)acrylate, isononyl (meth)acrylate, isobornyl (meth)acrylate, 2-hydroxyethyl (meth)acrylate, 4-hydroxybutyl (meth)acrylate, and 6-hydroxyhexyl (meth)acrylate. These may be used singly or as combinations of two or more of them. Further, together with the esters, carboxyl group-containing monomers such as maleic acid and itaconic acid; and hydroxyl group-containing monomers such as 2-hydroxyethyl acrylate, 2-hydroxyethyl methacrylate, 4-hydroxybutyl (meth) acrylate, and 6-hydroxyhexyl (meth)acrylate may be used.

Further, monomers such as vinyl acetate, vinyl propionate, styrene, acrylamide, methacrylamide, mono- or diesters of maleic acid and derivatives thereof, N-methylolacrylamide, glycidyl acrylate, glycidyl methacrylate, N,N-dimethylaminoethyl acrylate, N,N-dimethylaminopropylmethacrylamide, 2-hydroxypropyl acrylate, acryloylmorpholine, N,N-dimethylacrylamide, N,N-diethylacrylamide, imide acrylate, N-vinylpyrrolidone, oligoester acrylate, ε-caprolactone acrylate, dicyclopentanyl (meth)acrylate, dicyclopentenyl (meth) acrylate, methoxylated cyclododecatriene acrylate, and methoxyethyl acrylate may be copolymerized. The kind and amount of the copolymerizable monomers can be determined as appropriate taking into consideration the properties of the resultant composite film and so on.

The acrylic-based polymer that can be used in the present invention is preferably one obtained by copolymerizing a nitrogen-containing monomer. Introduction of the nitrogen-containing monomer into the acrylic-based polymer by copolymerization results in an increase in anchorage with the pressure-sensitive adhesive layer. Examples of the nitrogen-containing monomer that can be used include N,N-dimethylaminoethyl(meth)acrylate, N,N-dimethylaminopropyl (meth)acrylamide, N,N-diethylaminoethyl (meth)acrylate, (meth)acrylamide, N-methyl(meth)acrylamide, N,N-dimethyl(meth)acrylamide, N,N-diethyl(meth)acrylamide, N,N-dibutyl(meth)acrylamide, N-t-butyl(meth)acrylamide, (meth)acryloylmorpholine, (meth)acryloylpyrrolidone, (meth)acryloylpiperidine, and (meth)acryloylpyrrolidine.

The vinyl-based monomer used in the present invention preferably contains a bifunctional urethane acrylate. The bifunctional urethane acrylate can be obtained by reaction between an isocyanate-terminated prepolymer and an acrylate having a group that can react with an isocyanate. The isocyanate-terminated prepolymer is obtained by reacting a bifunctional polyol used in the formation of the urethane polymer to be explained hereinafter with an isocyanate used in the formation of the urethane polymer to be explained hereinafter. Examples of the acrylate having a group that can react with an isocyanate include 2-hydroxyethyl (meth)acrylate and 4-hydroxyethyl (meth)acrylate and the like. Alternatively, the vinyl-based monomer can be obtained by reaction between a hydroxyl-terminated prepolymer and a 2-(meth) acryloyloxyethyl isocyanate and the like. The hydroxyl-terminated prepolymer can be obtained by reacting the bifunctional polyol to be explained hereinafter with the diisocyanate to be explained hereinafter. Further, various commercially available bifunctional urethane acrylates can be used. Examples thereof include "UV-3200B" (trade name, manufactured by Nippon Synthetic Chemical Industry Co., Ltd.) as an ester-based urethane acrylate, "UV-3700B" (trade name, manufactured by Nippon Synthetic Chemical Industry Co., Ltd.) as an ether-based urethane acrylate, and "UV-3310B" (tradename, manufactured by Nippon Synthetic Chemical Industry Co., Ltd.) as a carbonate-based urethane acrylate.

Further, other polyfunctional monomers may be added as far as the characteristics of the present invention are not deteriorated. Examples of such polyfunctional monomer include ethylene glycol di(meth)acrylate, propylene glycol di(meth)acrylate, hexanediol di(meth)acrylate, neopentyl glycol di(meth)acrylate, trimethylolpropane tri(meth)acrylate, pentaerythritol tri(meth)acrylate, dipentaerythritol hexa (meth)acrylate, epoxyacrylate, and polyester acrylate and the like.

The bifunctional urethane acrylate is contained in amounts of 1 part by weight or more and 50 parts by weight or less, preferably 2 parts by weight or more and 25 parts by weight or less based on 100 parts by weight of the vinyl-based monomer except urethan acrylates. When the content of the bifunctional urethane acrylate is 1 part by weight or more, the anchoring effect between the pressure-sensitive adhesive layer and the intermediate layer can be increased and at the same time the cohesive force of the intermediate layer is sufficient, so that cutting scrap will not increase. On the other hand, when the content of the bifunctional urethane acrylate is 50 parts by weight or less, the elastic modulus of the intermediate layer is within an appropriate range, so that the multilayer sheet can follow up the unevenness on the pattern surface of the wafer satisfactorily.

Use of vinyl-based polymer that contains a bifunctional urethane acrylate as the vinyl-based polymer that constitutes the composite film used in the present invention can lead to an increased anchorage between the pressure-sensitive adhesive layer and the composite film.

In the formation of the composite film to be used in the present invention, a polyfunctional monomer such as trimethylolpropane triacrylate or dipentaerythritol hexaacrylate may be used as a crosslinking agent as necessary.

The kind, combination and amount to be used of the radical polymerizable monomers can be determined as appropriate taking into consideration compatibility with urethane, polymerizability upon curing with light such as radiation, and characteristics of the resultant high polymer.

The urethane polymer can be obtained by reacting a polyol with a polyisocyanate. The reaction of the isocyanate with the hydroxyl group of the polyol can be performed with a catalyst. For example, those catalysts that are generally used in urethane reaction, such as dibutyl tin dilaurate, tin octoate, and 1,4-diazabicyclo[2.2.2]octane, can be used. In the present invention, tin-based catalysts, which facilitate production of urethane polymers having higher molecular weights are preferably used.

The polyol component that constitutes the urethane polymer includes a polyolefin-based diol.

The polyolefin-based diols that can be used include 1,2-polybutadiene and hydrogenated derivatives thereof, 1,4-polybutadiene and hydrogenated derivatives thereof, polyisoprene and hydrogenated derivatives thereof, polymers having a main skeleton of polyisobutylene or the like with a hydroxyl group on each terminal thereof. In the present invention, in particular, hydrogenated 1,2-polybutadiene is preferably used. Generally, the polyolefin-based diols can be produced by radical polymerization of conjugated diene monomer (such as butadiene or isoprene) using a hydroxyl group-containing radical polymerization initiator such as hydrogen peroxide to provide a conjugated diene-based polymer having a hydroxyl group at terminals directly, and hydrogenating the resultant hydroxyl group-containing conjugated diene polymer by a conventional method. The polyolefin diol can also be produced by anion living polymerization.

The polyolefin-based diol has a number average molecular weight of preferably 300 to 10,000, more preferably 500 to 5,000. When the number average molecular weight of the polyolefin-based diol is less than 300, the urethane polymer becomes rigid so that it can not follow up the unevenness of an adhered (for example, pattern surface of a wafer). On the other hand, when the number average molecular weight exceeds 10,000, the viscosity of the polyol itself is high and the polyol may have poor workability.

Commercially products of such polyolefin-based diols include "NISSO-PB GI series" (manufactured by Nippon Soda Co., Ltd.), which is liquid polybutadiene, "Poly bd" (manufactured by Idemitsu Kosan Co., Ltd.) and "Poly bd" and "Epol" (manufactured by Idemitsu Kosan Co., Ltd.), which are liquid polyisoprenes.

In the present invention, other polyols may be used in combination. The other polyols that can be used in combination are preferably those having two or more hydroxyl groups in the molecule. Low molecular weight polyols include dihydric alcohols such as ethylene glycol, diethylene glycol, propylene glycol, butylene glycol, and hexamethylene glycol; trihydric alcohols such as trimethylolpropane and glycerol; and tetrahydric alcohols such as pentaerythritol.

Examples of the high molecular weight polyol include ethylene oxide, propylene oxide, polyether polyol obtained by addition polymerization of tetrahydrofuran, polyester polyols that are condensation products between the above-mentioned dihydric alcohol, such as dipropylene glycol, 1,4-butanediol, 1,6-hexanediol or neopentyl glycol with a dibasic acid such as adipic acid, azelaic acid, or sebacic acid, acryl polyols, carbonate polyols, epoxy polyols, and caprolactone polyols. Among these, polyether polyols and polyester polyols are preferable. Examples of the acrylic polyol include copolymers of hydroxyl group-containing monomers such as hydroxyethyl (meth)acrylate and hydroxypropyl (meth)acrylate and in addition, copolymers of a hydroxyl group-containing substance and an acrylic-based monomer. The epoxy polyols include amine-modified epoxy resins.

In the present invention, the above-mentioned polyolefin-based diols can be used singly or in combinations of two or more of them, further can be used in combinations of one or more of the above-mentioned combinable other polyols. When strength is required, it is effective to introduce a crosslinking structure in the polymer by use of a triol or increase the amount of urethane hard segment by use of a low molecular weight diol. When importance is posed on elongation, it is preferable that a diol having a large molecular weight is used singly. The polyether polyols generally are inexpensive and have good water resistance. The polyester polyols have high strengths. In the present invention, the kind and amount of polyol can be selected freely depending on the utility and purpose. The kind and molecular weight, and amount of polyols to be used may be selected as appropriate also from the viewpoints of properties of films coated, reactivity with isocyanate and compatibility with the acrylic.

As the polyisocyanates, aromatic, aliphatic, and alicyclic diisocyanates, dimers, trimers and so on of the diisocyanates may be used. Examples of the aromatic, aliphatic, and alicyclic diisocyanates include tolylene diisocyanate, diphenylmethane diisocyanate, hexamethylene diisocyanate, xylylene diisocyanate, hydrogenated xylylene diisocyanate, isophorone diisocyanate, hydrogenated diphenylmethane diisocyanate, 1,5-naphthylene diisocyanate, 1,3-phenylene diisocyanate, 1,4-phenylene diisocyanate, butane-1,4-diisocyanate, 2,2,4-trimethylhexamethylene diisocyanate, 2,4,4-trimethylhexamethylene diisocyanate, cyclohexane-1,4-diisocyanate, dicyclohexylmethane-4,4-diisocyanate, 1,3-bis(isocyanatomethyl)cyclohexane, methylcyclohexane diisocyanate, and m-tetramethylxylylene diisocyanate. Also, dimers and trimers of these and polyphenylmethane polyisocyanates may be used. The trimers include isocyanurate type, biuret type, allophanate type and so on and are used as appropriate.

The polyisocyanates may be used singly or as combinations of two or more of them. The kind, combinations and so on of the polyisocyanate may be selected as appropriate from the viewpoints of reactivity with the urethane polymer, compatibility with the acrylic-based polymer and so on.

In the present invention, the amounts of the polyol component and polyisocyanate component for forming the urethane polymer are not particularly limited. For example, the amount of the polyol component to be used to that of the polyisocyanate component is such that an NCO/OH ratio (equivalent ratio) is preferably 0.8 or more, more preferably 0.8 or more and 3.0 or less, particularly preferably 1.0 or more and 3.0 or less. When the NCO/OH ratio is less than 0.8, the molecular chain of the urethane polymer can not be extended adequately so that the urethane polymer tends to have a decreased cohesive property, a decreased strength of film and a decreased elongation. While when the NCO/OH ratio is 3.0 or less, the urethane polymer can have a sufficient flexibility.

The composite film may contain commonly used additives, for example, ultraviolet absorbents, antioxidants, fillers, pigments, colorants, flame retardants, and antistatic agents as necessary as far as they do not deteriorate the effects of the present invention. The additives may be used in amounts usually used depending on their kind. The additives may be added either in advance before the polymerization reaction between the polyisocyanate and the polyol or before the polymerization reaction between the urethane polymer and the reactive monomer.

Further, to adjust the viscosity upon coating, a small amount of a solvent may be added to the coating composition. The solvent can be selected as appropriate from those solvents that are commonly used. Examples of such solvent include ethyl acetate, toluene, chloroform, and dimethylformamide.

In the present invention, as described above, the reaction of the polyol and the isocyanate is performed, for example, in the radical polymerizable monomer and a mixture of the urethane polymer and the radical polymerizable monomer is coated on a first film, and optically cured by irradiating ionized radiation such as α-ray, β-ray, γ-ray, neutron beam, or electron bean, radiation such as ultraviolet ray, or visible light depending on the kind of the optical polymerization initiator used to form a composite film.

In this case, to avoid inhibition of polymerization due to oxygen, a release-treated sheet may be covered over the mixture of the urethane polymer and the radical polymerizable monomer, coated on the first film to shut out oxygen. Alternatively, the base material may be placed in a vessel filled with an inert gas to decrease the concentration of oxygen in the atmosphere. Alternatively, the composite film may be formed by placing a second film over the coated mixture and then irradiating radiation onto the coated mixture.

In the present invention, the kind of radiation and so on and the kind and the like of the lamp to be used for irradiation may be selected as appropriate, and low pressure lamps such as a fluorescent chemical lamp, a black light, and a bactericidal lamp as well as high pressure lamps such as a metal halide lamp and a high pressure mercury lamp can be used.

The dose of ultraviolet ray and the like may be set arbitrarily depending on the required characteristics of the film. Generally, the dose of ultraviolet ray is 100 to 5,000 mJ/cm$^2$, preferably 1,000 to 4,000 mJ/cm$^2$, more preferably 2,000 to 3,000 mJ/cm$^2$. When the dose of ultraviolet ray is less than 100 mJ/cm$^2$, no sufficient polymerization degree can not be obtained while a dose of ultraviolet ray more than 5,000 mJ/cm$^2$ may cause deterioration of the resultant cured composite film.

Further, the temperature at which ultraviolet ray is irradiated is not particularly limited and may be set arbitrarily. When the temperature is too high, a stop reaction due to polymerization heat tends to occur, resulting in a decrease in the characteristics. Usually, the irradiation temperature is 70° C. or less, preferably 50° C. or less, and more preferably 30° C. or less.

The mixture that contains the urethane polymer and the radical polymerizable monomer as major components contains an optical polymerization initiator. Examples of the optical polymerization initiator that can be preferably used in the present invention include benzoin ethers such as benzoin methyl ether and benzoin isopropyl ether; substituted benzoin ethers such as anisole methyl ether; substituted acetophenones such as 2,2-diethoxyacetophenone and 2,2-dimethoxy-2-phenylacetophenone; substituted α-ketols such as 1-hydroxycyclohexyl phenyl ketone and 2-methyl-2-hydroxypropiophenone; aromatic sulfonyl chloride such as 2-naphthalenesulfonyl chloride; optically active oximes such as 1-phenyl-1,1-propanedione-2-(o-ethoxycarbonyl)oxime.

In the present invention, it is particularly desirable that optical polymerization initiators that have hydroxyl groups in the molecule be used. When a urethane polymer is formed by reacting a polyol and a polyisocyanate, coexistence of the optical polymerization initiator having a hydroxyl group in the molecule allows the urethane polymer to incorporate the optical polymerization initiator therein, with the result that when irradiated with radiation to effect curing, a urethane-acrylic block polymer can be produced. It is presumed that the resultant polymer can have an increased elongation and strength due to this effect.

The thicknesses of the composite film and other films in the multilayer sheet of the present invention can be selected as appropriate depending on the purpose and so on. In particular, when the multilayer sheet is used in processing high precision parts, the composite film is as thick as preferably 10 to 300 μm, more preferably 30 to 300 μm, particularly preferably 50 to 250 μm, and more particularly preferably 50 to 200 μm. The other films may have a thickness of preferably 10 to 300 μm, more preferably 30 to 200 μm.

Figure 2A:
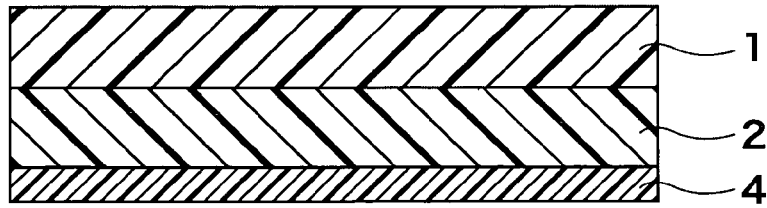
FIG. 2A is a cross-sectional view showing a layer structure of a pressure-sensitive adhesive sheet according to a first embodiment of the present invention.
Figure 2B:
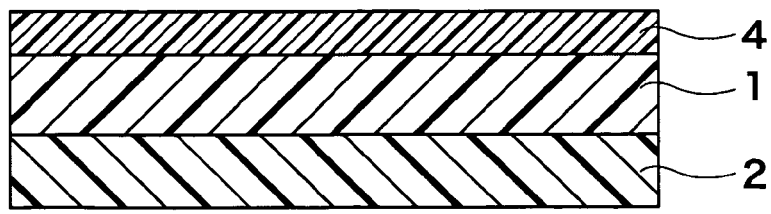
FIG. 2B is a cross-sectional view showing a layer structure of a pressure-sensitive adhesive sheet according to a second embodiment of the present invention.

The multilayer sheet of the present invention may be provided with a pressure-sensitive adhesive layer on one side thereof to form a pressure-sensitive adhesive sheet. The pressure-sensitive adhesive sheet according to an embodiment of the present invention is explained concretely referring to FIGS. 2A and 2B. Here, explanation is made with respect to the case in which the multilayer sheet of the present invention as shown in FIG. 1A is provided with a pressure-sensitive adhesive layer. FIG. 2A is a cross-sectional view showing a layer structure of the pressure-sensitive adhesive sheet according to a first embodiment of the present invention. The pressure-sensitive adhesive sheet shown in FIG. 2A, which is a multilayer sheet obtained by laminating the composite film 2 and the first film 1, has a pressure-sensitive adhesive layer 4 on the side of the composite film 2. On the other hand, the pressure-sensitive adhesive sheet shown in FIG. 2B has the pressure-sensitive adhesive layer 4 on the side of the first film 1. Thus, in the present invention, a pressure-sensitive adhesive layer may be provided on either one of the sides of the multilayer sheet to prepare a pressure-sensitive adhesive sheet.

The pressure-sensitive adhesive layer must have an adhesive force such that it has a moderate adhesive force when articles such as semiconductor wafers are processed so that the articles can be held without fail and after the processing is over, it can be peeled off from the articles without loads on the articles. For this purpose, it is preferable that the pressure-sensitive adhesive layer has a 180° peel adhesive strength, when peeled off after processing, within the range of 0.01 N/20 mm to 1N/20 mm suitable adhesive force.

The composition of pressure-sensitive adhesive that constitutes such a pressure-sensitive adhesive layer is not particularly limited and known pressure-sensitive adhesives used for bonding and fixing semiconductor wafers and so on can be used. For example, rubber-based pressure-sensitive adhesives that contain a rubber-based polymer such as natural rubber or styrene-based copolymer as a base polymer, silicone-based pressure-sensitive adhesives, acrylic based pressure-sensitive adhesives, polyvinyl ether-based pressure-sensitive adhesives and so on can be used. Among these, acrylic-based pressure-sensitive adhesives that contain acrylic-based polymers as a base polymer are preferable from the viewpoints of adhesion to semiconductor wafers, washability of the semiconductor wafers after the peeling with super pure water or organic solvents such as alcohols.

The acrylic-based polymers include those acrylic-based polymers obtained by providing as monomer components one or more of an alkyl (meth) acrylate (for example, linear or branched alkyl esters having 1 to 30 carbon atoms, particularly 4 to 18 carbon atoms in the alkyl moiety, such as methyl esters, ethyl esters, propyl esters, isopropyl esters, butyl esters, isobutyl esters, s-butyl esters, t-butyl esters, pentyl esters, isopentyl esters, hexyl esters, heptyl esters, octyl esters, 2-ethylhexyl esters, isooctyl esters, nonyl esters, decyl esters, isodecyl esters, undecyl esters, dodecyl esters, tridecyl esters, tetradecyl esters, hexadecyl esters, octadecyl esters, eicosyl esters, etc.) and one or more of a cycloalkyl (meth) acrylate (for example, cyclopentyl esters, cyclohexyl esters, etc.) and polymerizing these monomer components. Note that the term "(meth)acrylates" refer to acrylates and/or methacrylates (i.e., acrylates, methacrylates, or both acrylates and methacrylates). The term "(meth)" as used herein for all the occurrences shall be understood similarly.

To improve cohesion, heat resistance and the like properties, the acrylic-based polymer may contain a unit that corresponds to other monomer component copolymerizable with the alkyl (meth)acrylate or cycloalkyl ester. Examples of such a monomer component include carboxylic group-containing monomers such as acrylic acid, methacrylic acid, carboxyethyl (meth)acrylate, carboxypentyl (meth)acrylate, itaconic acid, maleic acid, fumaric acid, and crotonic acid; acid anhydride monomers such as maleic anhydride and itaconic anhydride; hydroxyl group-containing monomers such as 2-hydroxylethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl)methyl (meth)acrylate; sulfonate group-containing monomers such as styrenesulfonic acid, allyl sulfonate, 2-(meth)acrylamide-2-methylpropanesulfonate, (meth)acrylamidepropanesulfonic acid, sulfopropyl (meth)acrylate, and (meth)acryloyloxynaphthalenesulfonate; phosphate group-containing monomers such as 2-hydroxyethylacryloyl phosphate; acrylamide, and acrylonitrile and so on. These copolymerizable monomer components can be used singly or two or more of them can be used in combination. The amount of the copolymerizable monomers is preferably 40% by weight or less based on the total monomer components.

Further, the acrylic-based polymer may contain a polyfunctional monomer for crosslinking. Examples of the polyfunctional monomer include hexanediol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri(meth)acrylate, pentaerythritol tri(meth)acrylate, dipentaerythritol hexa(meth)acrylate, epoxy(meth)acrylate, polyester (meth)acrylate, and urethane (meth)acrylate and so on. Also, these polyfunctional monomers can be used singly or two or more of them can be used in combination. The amount of the polyfunctional monomer to be used is preferably 30% by weight or less based on the total monomer components from the viewpoint of adhesive properties and so on.

The polymerization method for forming the acrylic-based polymer may be any of a solution polymerization method, an emulsion polymerization method, a mass polymerization method, a suspension polymerization method and so on. The pressure-sensitive adhesive layer preferably contains a smaller amount of low molecular weight substances in order not to contaminate the affixing surface of the articles such as semiconductor wafers. From this viewpoint, the acrylic-based polymer has a weight average molecular weight of, preferably about 300,000 or more, more preferably about 400,000 to about 3,000,000.

To increase the weight average molecular weight of the acrylic-based polymer, the acrylic-based polymer may contain a polyisocyanate compound, an epoxy compound, an aziridine compound, a melamine crosslinking agent and so on. The amounts thereof may be determined as appropriate depending on balance with the base polymer to be crosslinked and further the intended utility of the resultant pressure-sensitive adhesive. Generally, about 1 to about 5 parts by weight of such additives based on 100 parts by weight of the base polymer. Further, the pressure-sensitive adhesive may contain in addition to the above-mentioned components, various conventional additives such as tackifiers and antioxidants as necessary.

In the present invention, preferably a radiation curing-type pressure-sensitive adhesive is used as the pressure-sensitive adhesive. The radiation curing-type pressure-sensitive adhesive can be obtained, for example, by blending the pressure-sensitive adhesive substance with an oligomer component that cures upon irradiation of, for example, radiation to form a low adhesive substance. With the pressure-sensitive adhesive layer formed from the radiation curing-type pressure-sensitive adhesive, when the sheet is affixed, the pressure-sensitive adhesive sheet can be readily affixed due to the oligomer component, which imparts the pressure-sensitive adhesive with plastic flowability, while when the sheet is to be peeled off, irradiation of radiation results in formation of a low adhesive substance, which facilitates peeling of the pressure-sensitive adhesive sheet from the articles such as semiconductor wafers.

As the radiation curing-type pressure-sensitive adhesives, those pressure-sensitive adhesives that contain a radiation-curable functional group such as carbon-carbon double bond in the molecule and exhibit adhesive property can be used. For example, addition-type radiation curing-type pressure-sensitive adhesive containing generally used pressure-sensitive adhesive that has blended therewith a radiation curing-type monomer component or an oligomer component, or a endogenous type radiation curing-type pressure-sensitive adhesive whose base polymer has a carbon-carbon double bond in the side chain or main chain or terminals thereof may be used. Examples of the radiation that is used to cure the pressure-sensitive adhesive layer include X ray, electron beam, and ultraviolet ray. Because of easy handling, it is preferable that ultraviolet ray be used. However, the present invention should not be construed as being limited thereto.

As a general pressure-sensitive adhesive that constitutes the addition-type radiation curing-type pressure-sensitive adhesive, pressure-sensitive adhesives such as the above-mentioned acrylic-based pressure-sensitive adhesive and rubber-based pressure-sensitive adhesive can be used.

Examples of the monomer having a functional group that is radiation curable include urethane oligomers, urethane (meth)acrylate, trimethylolpropane tri(meth)acrylate, tetramethylolmethane tetra(meth)acrylate, pentaerythritol tri (meth)acrylate, pentaerythritol tetra(meth)acrylate, dipentaerythritol monohydroxypenta(meth)acrylate, dipentaerythritol hexa(meth)acrylate, and 1,4-butanediol di(meth)acrylate and so on. Examples of the radiation curing-type oligomer component include various oligomers such as urethane-based oligomers, polyether-based oligomers, polyester-based oligomers, polycarbonate-based oligomers, and polybutadiene-based oligomers. Those oligomers having a molecular weight within the range of about 100 to about 30,000 are suitable. For example, the blending amount of the monomer component or oligomer component having a radiation curing-type functional group is within the range of preferably 5 to 500 parts by weight, more preferably about 40 to about 150 parts by weight based on 100 parts by weight of the base polymer, such as acrylic-based polymer that constitutes the pressure-sensitive adhesive.

The endogenous radiation curing-type pressure-sensitive adhesives do not have to or most of them do not, contain oligomer components which are low polymerization degree components, so that the oligomer components and the like do not undergo migration in the pressure-sensitive adhesive layer with lapse of time, which allows formation of a pressure-sensitive adhesive layer with a stable layer structure.

In the case of the endogenous radiation curing type pressure-sensitive adhesive, a base polymer having a carbon-carbon double bond and exhibits tackiness can be used without limitations. Such abase polymer preferably has a basic skeleton of an acrylic-based polymer. Here, the acrylic-based polymer used may the same acrylic-based polymers exemplified in the description of the acrylic-based pressure-sensitive adhesive.

The method for introducing a carbon-carbon double bond into an acrylic-based polymer as a basic skeleton is not particularly limited and various methods may be adopted. In the present invention, it is preferable that the carbon-carbon double bond is introduced into side chain of the acrylic-based polymer to form a base polymer having a carbon-carbon double bond. Specifically, the carbon-carbon double bond can be introduced, for example, by preliminarily copolymerizing an acrylic-based polymer with a monomer having a first functional group, and then reacting the resultant polymer with a compound having a carbon-carbon double bond and a second functional group that can react with the first functional group by condensation or addition reaction such that the radiation curability of the carbon-carbon double bond is maintained to introduce the carbon-carbon double bond into the side chain of the acrylic-based polymer.

Examples of combination of the functional group of a monomer to be copolymerized with the acrylic-based polymer (first function group) and a functional group that can react with the functional group of the monomer (second functional group) are presented below. Such combinations include, for example, a carboxylate group and an epoxy group, a carboxylate group and an aziridyl group, a hydroxyl group and an isocyanate group, and so on. Among the combinations of functional groups, the combination of a hydroxyl group and an isocyanate group is preferable in view of ease of tracing the reaction. Further, in the presented combinations, any of the functional groups in the combination may be present on the acrylic-based polymer. For example, in the combination of a hydroxyl group and an isocyanate group, it is preferable that the acrylic-based polymer has a hydroxyl group and the compound having a functional group (i.e., second functional group) that can react with the functional group of the monomer to be preliminarily copolymerized with the acrylic-based polymer (i.e., first functional group) has an isocyanate group. In this case, examples of the compound having an isocyanate group include methacryloyl isocyanate, 2-methacryloyloxyethyl isocyanate, and m-isopropenyl-α,α-dimethylbenzyl isocyanate. Examples of the acrylic-based polymer having a functional group (here, a hydroxyl group) include those acrylic-based polymers that are copolymerized with one or more compounds selected from the group comprising the above-mentioned hydroxyl group-containing monomers that have been exemplified in the description with respect to the acrylic-based pressure-sensitive adhesives and in addition 2-hydroxyethyl vinyl-based ether compounds, 4-hydroxybutyl vinyl ether-based compounds, and diethylene glycol monovinyl ether-based compounds.

The endogenous radiation curing-type pressure-sensitive adhesives may contain the base polymers having a carbon-carbon double bond singly. However, the above-mentioned radiation curing-type monomer components and oligomer components may be blended as far as they do not deteriorate the characteristics of the resultant pressure-sensitive adhesives. The amount of the oligomer component to be blended is usually 30 parts by weight or less, preferably 0 to 10 parts by weight, based on 100 parts by weight of the base polymer.

The above-mentioned radiation curing-type pressure-sensitive adhesives may contain an optical polymerization initiator when they are cured with radiation such as ultraviolet ray. Examples of the optical polymerization initiator include α-ketol compounds such as 4-(2-hydroxyethoxy)phenyl (2-hydroxy-2-propyl) ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride-based compounds such as 2-naphthalenesulfonyl chloride; optically active oxime compounds such as 1-phenone-1,1-propanedione-2-(o-ethoxycarbonyl)oxime; benzophenone compounds such as benzophenone, benzoyl benzoate, and 3,3'-dimethyl-4-methoxybenzophenone; thioxanthone-based compounds such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone, halogenated ketones, acylphosphinoxides, and acyl phosphinates.

The amount of the optical polymerization initiator to be blended is, for example, about 1 to about 10 parts by weight, preferably about 3 to about 5 parts by weight based on 100 parts by weight of the base polymer such as the acrylic-based polymer that constitute the pressure-sensitive adhesive.

In the present invention, the pressure-sensitive adhesive layer may be formed by directly coating the above-mentioned pressure-sensitive adhesive on an intermediate layer by using a solvent or the like as necessary, or by preliminarily coating the pressure-sensitive adhesive on a release liner or the like to form a pressure-sensitive adhesive layer and applying the pressure-sensitive adhesive layer onto an intermediate layer.

Further, the thickness of the pressure-sensitive adhesive layer is not particularly limited and arbitrarily selected. The thickness of the pressure-sensitive adhesive layer is usually about 3 to about 100 μm, preferably about 10 to about 50 μm, more preferably about 10 to about 50 μm, and particularly preferably about 10 to about 30 μm.

The pressure-sensitive adhesive sheet of the present invention is used by a conventional method that is used when articles, for example, semiconductor wafers are processed. Here, an example case is presented where the pressure-sensitive adhesive sheet is used for polishing the backside of a semiconductor wafer. In this case, first a semiconductor wafer is mounted on a table such that a pattern surface, i.e., a surface on which a pattern such as IC circuitry is provided is up and the pressure-sensitive adhesive sheet of the present invention is superimposed on the pattern surface such that the pressure-sensitive adhesive layer side contact the pattern surface. Then, the pressure-sensitive adhesive sheet is affixed by pressing it by press means such as a press roll. Alternatively, the semiconductor wafer and the pressure-sensitive adhesive sheet are placed in a compressible vessel (for example, an autoclave) as superimposed in the above-mentioned manner and then the inner pressure of the vessel is increased to have the semiconductor wafer and the pressure-sensitive adhesive sheet affixed to each other. A press means may be used in combination. Alternatively, the semiconductor wafer and the pressure-sensitive adhesive sheet can be affixed to each other in a vacuum chamber. Further, the pressure-sensitive adhesive sheet can be affixed to the semiconductor wafer by heating the pressure-sensitive adhesive sheet to a temperature equal to or less than the melting point of the base material of the pressure-sensitive adhesive sheet.

The method for polishing the backside of a semiconductor wafer is performed by a conventional polishing method. For example, a semiconductor wafer onto which a pressure-sensitive adhesive sheet is affixed in the above-mentioned manner is mounted on a polisher (back grinder) used as a processing machine for polishing and the backside of the wafer is polished to a desired thickness using a CMC (Chemical Mechanical Polishing) pad. When a pressure-sensitive adhesive sheet of which the pressure-sensitive adhesive layer is formed from the radiation curing-type pressure-sensitive adhesive is used, radiation is irradiated to the pressure-sensitive adhesive sheet after the polishing is finished to decrease the adhesive strength of the pressure-sensitive adhesive layer before the pressure-sensitive adhesive sheet can be peeled off from the wafer.

The pressure-sensitive adhesive sheet of the present invention has a composite film constituting the intermediate layer is formed by using urethane polymer mede from a polyolefin-based diol and a polyisocyanate, so that there occurs no contamination of articles such as wafers with the urethane polymer which is otherwise contained in the composite film when they are polished after being affixed on the surface thereof with the pressure-sensitive adhesive sheet. Therefore, after the polishing wafers, the wafers have a smaller amount of residual organic components on the surface thereof so that low contamination polishing can be achieved, which avoids wire bonding failure or breakage of the sealant resin.

Moreover, when the pressure-sensitive adhesive sheet of the present invention is formed such that the composite film constituting it is formed from an acrylic-based polymer that is copolymerized with a nitrogen-containing monomer or a vinyl-based polymer containing a bifunctional urethane acrylate, a pressure-sensitive adhesive sheet having satisfactory anchoring power between the pressure-sensitive adhesive layer and the intermediate layer can be realized.

EXAMPLES

Hereinafter, the present invention is explained by examples. However, the present invention is not limited thereto. In the following examples, all parts are by weight.

Example 1

In a reactor equipped with a condenser, a thermometer, and an agitator were charged 25 parts of t-butyl acrylate (t-BA) and 15 parts of n-butyl acrylate (BA) as acrylic monomers, 45 parts of hydrogenated 1,2-polybutadiene having a number average molecular weight of 1,500 (trade name "GI-1000", manufactured by Nippon Soda Co., Ltd.) as a polyol, 0.15 parts of 1-[4-(2-hydroxyethoxy)phenyl]-2-hydroxy-2-methyl-1-propan-1-one (trade name "Irgacure 2959", manufactured by Ciba Specialty Chemicals Co., Ltd.), and 0.025 part of dibutyltin dilaurate as a urethane reaction catalyst. While agitating the resultant mixture, 5 parts of xylylene diisocyanate (XDI) was dripped and the mixture was allowed to react at 65° C. for 2 hours. After cooling the reaction mixture to room temperature, 10 parts of acrylic acid (AA), 2 parts of acryloylmorpholine (ACMO), 0.5 part of trimethylolpropane triacrylate (TMPTA) as a polyfunctional monomer were added to the mixture to obtain a urethane polymer-acrylic based monomer mixture. The amounts of polyisocyanate component and polyol component used were such that NCO/OH (equivalent ratio)=1.1.

The urethane polymer-acrylic monomer mixture was coated on a 75-μm-thick polyethylene terephthalate film (PET film) to a thickness after curing of 100 μm. On this, a release-treated PET film (thickness: 38 μm) was superimposed and then ultraviolet ray (illuminance: 163 mW/cm$^2$, light amount: 2,100 mJ/cm$^2$) from a high pressure mercury lamp was irradiated for curing to form a composite film as an intermediate layer on the PET film. Thereafter, the superimposed release-treated PET film was peeled off to obtain a multilayer sheet (support) of PET film/composite film.

Then, a blend of 100 parts of n-butyl acrylate (BA) and 3 parts of acrylic acid (AA) was copolymerized in ethyl acetate solution to obtain an acrylic-based copolymer having a number average molecular weight of 260,000. To 100 parts of the acrylic-based copolymer were further added 2 parts of a polyisocyanate crosslinking agent, 2 parts of an epoxy crosslinking agent and the resultant mixture was coated on the obtained multilayer sheet (support) on the side of the composite film to form a 30-μm-thick pressure-sensitive adhesive layer, thereby forming a pressure-sensitive adhesive sheet.

Example 2

A multilayer sheet (support) was formed in the same manner as that in Example 1 except that 25 parts of t-butyl acrylate (t-BA), 20 parts of n-butyl acrylate (BA), 5 parts of acrylic acid (AA), and 2 parts of acryloylmorpholine (ACMO), respectively, were used as acrylic-based monomers as shown in Table 1. Further, a pressure-sensitive adhesive layer was formed from the obtained multilayer sheet on the side of the composite film in the same manner as in Example 1 to prepare a pressure-sensitive adhesive sheet.

Example 3

A multilayer sheet (support) was formed in the same manner as that in Example 1 except that 40 parts of t-butyl acrylate (t-BA), 10 parts of n-butyl acrylate (BA), and 2 parts of acryloylmorpholine (ACMO) as acrylic-based monomers, 46 parts of hydrogenated polybutadiene having a hydroxyl group on both terminals thereof having a number average molecular weight of 2,100 (trade name "GI-2000", manufactured by Nippon Soda Co., Ltd.) as a polyol, and 4 parts of xylylene diisocyanate (XDI) (NCO/OH=1.1), respectively, were used as shown in Table 1. Further, a pressure-sensitive adhesive layer was formed from the obtained multilayer sheet on the side of the composite film in the same manner as in Example 1 to prepare a pressure-sensitive adhesive sheet.

Example 4

In a reactor equipped with a condenser, a thermometer, and an agitator were charged 30 parts of t-butyl acrylate (t-BA) and 21 parts of n-butyl acrylate (BA) as acrylic-based monomers, 36 parts of hydrogenated 1,2-polybutadiene having a number average molecular weight of 1,500 and having a hydroxyl group (OH) on each terminal thereof (trade name "GI-1000", manufactured by Nippon Soda Co., Ltd.) as a polyol, and as an optical polymerization initiator, 0.13 parts of 2,2-dimethoxy-1,2-diphenylethan-1-one (trade name "Irgacure 651", manufactured by Ciba Specialty Chemicals Co., Ltd.), and 0.02 part of dibutyltin dilaurate as aurethane reaction catalyst. While agitating the resultant mixture, 4 parts of xylylene diisocyanate (XDI) was dripped and the mixture was allowed to react at 65° C. for 2 hours. After cooling the reaction mixture to room temperature, 9 parts of acrylic acid (AA), 2 parts of acryloylmorpholine (ACMO), 0.6 part of trimethylolpropane triacrylate (TMPTA) as a polyfunctional monomer were added to the mixture to obtain a urethane polymer-acrylic monomer mixture.

Using the obtained urethane polymer-acrylic monomer mixtures, multilayer sheets (supports) were formed in the same manner as in Example 1. Further, a pressure-sensitive adhesive layer was formed from the obtained multilayer sheet on the side of the composite film in the same manner as in Example 1 to prepare a pressure-sensitive adhesive sheet.

Comparative Example 1

In a reactor equipped with a condenser, a thermometer, and an agitator were charged 25 parts of t-butyl acrylate (t-BA) and 10 parts of n-butyl acrylate (BA) as acrylic-based monomers, 35 parts of polytetramethylene glycol (PTMG) (a number average molecular weight of 650, manufactured by Mitsubishi Chemical Co., Ltd.) as a polyol, 0.15 parts of 1-[4-(2-hydroxyethoxy)phenyl]-2-hydroxy-2-methyl-1-propan-1-one (trade name "Irgacure 2959", manufactured by Ciba Specialty Chemicals Co., Ltd.), and 0.025 part of dibutyltin dilaurate as a urethane reaction catalyst. While agitating the resultant mixture, 15 parts of xylylene diisocyanate (XDI) was dripped and the mixture was allowed to react at 65° C. for 2 hours. After cooling the reaction mixture to room temperature, 15 parts of acrylic acid (AA) and 3 parts of trimethylolpropane triacrylate (TMPTA) as a polyfunctional monomer were added to the mixture to obtain a urethane polymer-acrylic monomer mixture. The amounts of polyisocyanate component and polyol component used were such that NCO/OH (equivalent ratio)=1.25.

Using the obtained urethane polymer-acrylic-based monomer mixtures, multilayer sheets (supports) were formed in the same manner as in Example 1. Further, a pressure-sensitive adhesive layer was formed from the obtained multilayer sheet on the side of the intermediate layer in the same manner as in Example 1 to prepare a pressure-sensitive adhesive sheet.

Comparative Example 2

A multilayer sheet was prepared in the same manner as in Comparative Example 1 except that 20 parts of t-butyl acrylate (t-BA), 10 parts of n-butylacrylate (BA), and 10 parts of acrylic acid (AA) as acrylic-based monomers, 50 parts of polypropylene glycol having a number average molecular weight of 2,000 ("PP-2000", manufactured by Sanyo Chemical Industry Co., Ltd.) as a polyol, and 10 parts of xylylene diisocyanate (XDI) as a polyisocyanate. Further, a pressure-sensitive adhesive layer was formed from the obtained multilayer sheet on the side of the intermediate layer in the same manner as in Example 1 to prepare a pressure-sensitive adhesive sheet.

Comparative Example 3

In a reactor equipped with a condenser, a thermometer, and an agitator were charged 90 parts of n-butyl acrylate (BA), 10 parts of acrylic acid (AA), and 0.1 part of trimethylolpropane triacrylate as acrylic-based monomers, and 0.3 part of 1-hydroxycyclohexyl phenyl ketone (trade name "Irgacure 184", manufactured by Ciba Specialty Chemicals Co., Ltd.) as an optical polymerization initiator. The resultant mixture was exposed to ultraviolet ray under nitrogen atmosphere to partially optically polymerize the mixture to prepare syrup containing a prepolymer.

The obtained syrup containing a prepolymer was coated on a PET film in the same manner as in Comparative Example 1 to prepare an intermediate layer, thereby preparing a multilayer sheet of PET film/intermediate layer. Further, a pressure-sensitive adhesive layer was formed from the obtained multilayer sheet on the side of the intermediate layer in the same manner as in Example 1 to prepare a pressure-sensitive adhesive sheet.

Example 5

In a reactor equipped with a condenser, a thermometer, and an agitator were charged 25 parts of t-butyl acrylate (t-BA) and 15 parts of n-butyl acrylate (BA) as acrylic-based monomers, 45 parts of hydrogenated 1,2-polybutadiene having a number average molecular weight of 1,500 and having a hydroxyl group (OH) on each terminal thereof (trade name "GI-1000", manufactured by Nippon Soda Co., Ltd.) as a polyol, 0.1 part of 2,2-dimethoxy-1,2-diphenylethan-1-one (trade name "Irgacure 651", manufactured by Ciba Specialty Chemicals Co., Ltd.) as an optical polymerization initiator, and 0.03 part of dibutyltin dilaurate as a urethane reaction catalyst. While agitating the resultant mixture, 5 parts of xylylene diisocyanate (XDI) was dripped and the mixture was allowed to react at 75° C. for 2 hours. After cooling the reaction mixture to room temperature, 10 parts of acrylic acid (AA) and 1 part of ether urethane acrylate "UV-3700B", manufactured by Nippon Synthetic Chemistry Co., Ltd.) were added to the mixture to obtain a urethane polymer-acrylic monomer mixture. The amounts of polyisocyanate component and polyol component used were such that NCO/OH (equivalent ratio)=1.1.

The urethane polymer-acrylic monomer mixture was coated on a 75-μm-thick polyethylene terephthalate film (PET film) to a thickness after curing of 100 μm. On this, a release-treated PET film (thickness: 38 μm) as a separator was superimposed and then ultraviolet ray (illuminance: 200 mW/cm$^2$, light amount: 3,500 mJ/cm$^2$) from a high pressure mercury lamp was irradiated to the covered PET film surface for curing to form a composite film as an intermediate layer on the PET film. Thereafter, the superimposed release-treated PET film was peeled off to obtain a multilayer sheet (support) of PET film/composite film.

Then, a blend of 100 parts of n-butyl acrylate (BA) and 3 parts of acrylic acid (AA) was copolymerized in ethyl acetate solution to obtain an acrylic-based copolymer having a number average molecular weight of 400,000. To 100 parts of the acrylic-based copolymer were further added 2 parts of a polyisocyanate crosslinking agent and 2 parts of an epoxy crosslinking agent and the resultant mixture was coated on the obtained multilayer sheet (support) on the side of the composite film to form a 30-μm-thick pressure-sensitive adhesive layer, thereby forming a pressure-sensitive adhesive sheet.

Example 6

A multilayer sheet (support) was formed in the same manner as in Example 5 except that the blending amount of the ether-based urethane acrylate used for forming the composite film was changed to 10 parts of UV-3700B as shown in Table 1. Further, a pressure-sensitive adhesive layer was formed from the obtained multilayer sheet on the side of the composite film in the same manner as in Example 5 to prepare a pressure-sensitive adhesive sheet.

Example 7

A multilayer sheet (support) was formed in the same manner as in Example 5 except that the polyol used for forming the composite film was changed from GI1000 to GI2000, the blending amount of the polyol and the diisocyanate was changed to GI2000:XDI=46 parts:4 parts, and the blending amount of the ether-based urethane acrylate was changed to 10 parts of UV-3700B as shown in Table 1. Further, a pressure-sensitive adhesive layer was formed from the obtained multilayer sheet on the side of the composite film in the same manner as in Example 5 to prepare a pressure-sensitive adhesive sheet.

Example 8

A multilayer sheet (support) was formed in the same manner as in Example 5 except that the blending amount of the ether-based urethane acrylate used for forming the composite film was changed to 0.5 part of UV-3700B as shown in Table 1. Further, a pressure-sensitive adhesive layer was formed from the obtained multilayer sheet on the side of the composite film in the same manner as in Example 5 to prepare a pressure-sensitive adhesive sheet.

Example 9

A multilayer sheet (support) was formed in the same manner as in Example 5 except that the blending amount of the ether-based urethane acrylate used for forming the composite film was changed to 25 parts of UV-3700B as shown in Table 1. Further, a pressure-sensitive adhesive layer was formed from the obtained multilayer sheet on the side of the composite film in the same manner as in Example 5 to prepare a pressure-sensitive adhesive sheet.

Example 10

A multilayer sheet (support) was formed in the same manner as in Example 5 except that trimethylolpropane triacrylate (TMPTA) was used in place of the ether-based urethane acrylate "UV-3700B" used for forming the composite film as shown in Table 1. Further, a pressure-sensitive adhesive layer was formed from the obtained multilayer sheet on the side of the composite film in the same manner as in Example 5 to prepare a pressure-sensitive adhesive sheet.

Example 11

A multilayer sheet (support) was formed in the same manner as in Example 5 except that trimethylolpropane triacrylate (TMPTA) was used in place of the ether-based urethane acrylate "UV-3700B" used for forming the composite film and the blending amount of it was changed to 10 parts that of TMPTA as shown in Table 1. Further, a pressure-sensitive adhesive layer was formed from the obtained multilayer sheet on the side of the composite film in the same manner as in Example 5 to prepare a pressure-sensitive adhesive sheet.

<Evaluation Tests>

(1) Evaluation of Curl, Bend and Crack

Twenty 8-inch 625-μm-thick silicon wafers were provided. The obtained pressure-sensitive adhesive sheets were affixed using "DR-8500III" manufactured by Nitto Seiki Co., Ltd. and polished to a thickness of 50 μm using a silicon wafer polisher manufactured by Disco Co., Ltd. The polished wafers were evaluated on the following. Table 1 shows the results obtained.

(i) Curl

The silicon wafers after the polishing having the pressure-sensitive adhesive sheet thereon were placed as standing on a plate such that the pressure-sensitive adhesive sheet side was up. Then, the distance of the part of the silicon wafer that was most lifted and the plate (usually, an end of the wafer) was measured for each wafer. An average value of curls was calculated. The values were shown as an average of 20 measurements. Pressure-sensitive adhesive sheets exhibited an average curl of 5 mm or less were judged to be fair and those that exhibited an average curl of more than 8 mm were judged to be failure.

(ii) Bent

The silicon wafers after the polishing having the pressure-sensitive adhesive sheet thereon were housed in an 8-inch wafer cassette with the wafer side up. For the bent wafer due to the self weight, a distance between the highest part and the most bent, lowest part was defined as a bent (amount). The values are shown as an average of 20 measurements.

(iii) Crack

The number of silicon wafers of which cracks occur during the polishing was counted. The number of polished wafers was evaluated for 5 wafers.

(2) Evaluation of Contamination

The obtained sheets were evaluated for contamination by the following evaluation method.

That is, the obtained pressure-sensitive adhesive sheets were affixed to silicon wafers (3 to 4 atomic %) using a tape affixing machine "DR8500" manufactured by Nitto Seiki Co., Ltd. (affixing pressure: 2 MPa, affixing speed: 12 m/minute), and left to stand at 40° C. for one day. Then each pressure-sensitive adhesive sheet was peeled off from the wafer (peeling speed: 12 m/minute, peeling angle: 180°) using a tape peeler "HR8500" manufactured by Nitto Seiki Co., Ltd. The organic substance that was transferred onto the wafer was measured by using an X-ray photoelectron spectrometer (XPS). Wafers on which no pressure-sensitive adhesive sheets were affixed were also analyzed. The transfer amount of the organic substance was evaluated by the increase in atomic % of carbon atom detected. The atomic % of carbon atom was calculated from elemental ratios (total 100%) of carbon, nitrogen, oxygen, silicon, and so on.

XPS apparatus: ESCA "Quantum 2000" manufactured by Ulvac-Phi, Inc.

X-ray setting: Pointed analysis of 200 μm in diameter [30 W(15 kV)];

X-ray source: monochro Alkα;

Optoelectronic take-off angle: 45°;

Degree of vacuum: $5 \times 10^{-9}$ torr;

Neutralization condition: Combination of neutralization gun and ion gun (neutralization mode).

For narrow scan spectrum, the peak ascribable to the C—C bond of C1s was corrected to 285.0 eV.

(3) Anchoring Power

On the pressure-sensitive adhesive side of the obtained pressure-sensitive adhesive sheet was affixed a 50-μm-thick PET tape. Then T-peeling (a peeling method in which the ends of the pressure-sensitive adhesive sheet and of the PET tape were drawn in opposite directions at an angle of 180° to effect peel at the interface between the pressure-sensitive adhesive layer and the intermediate layer so that the angle between the peeled pressure-sensitive adhesive sheet and the PET tape was about 180°) was performed at the interface of the pressure-sensitive adhesive layer and the intermediate layer to measure a peeling power in this condition.

TABLE 1

| | Outermost layer | Intermediate layer | | | | | | | Pressure sensitive adhesive layer Thickness (μm) | Evaluation | | | | |
|---|---|---|---|---|---|---|---|---|---|---|---|---|---|---|---|
| | | Urethane (Part) | | Acrylic (Part) | | | | | Thickness (μm) | | Curl (mm) | Bend (mm) | Crack (Number) | Contamination ΔC | Anchoring power N/20 mm |
| | | Polyol | I* | BA | t-BA | AA | ACMO | TMPTA | | | | | | | |
| Ex. 1 | PET 75 μm | GI1000 45 | XDI 5 | 15 | 25 | 10 | 2 | 0.5 | 100 | 30 | 3 | 6 | 0 | 12 | 5.5 |
| Ex. 2 | PET 75 μm | GI1000 45 | XDI 5 | 20 | 25 | 5 | 2 | 0.5 | 100 | 30 | 3 | 7 | 0 | 11 | 5.7 |
| Ex. 3 | PET 75 μm | GI2000 46 | XDI 4 | 10 | 40 | | 2 | 0.5 | 100 | 30 | 4 | 6 | 0 | 11 | 4.2 |

TABLE 1-continued

| | Outer most layer | Intermediate layer | | | | | | | Pressure sensitive adhesive layer Thickness (μm) | Evaluation | | | | |
|---|---|---|---|---|---|---|---|---|---|---|---|---|---|---|---|
| | | Urethane (Part) | | Acrylic (Part) | | | | | Thickness (μm) | | Curl (mm) | Bend (mm) | Crack (Number) | Contamination ΔC | Anchoring power N/20 mm |
| | | Polyol | I* | BA | t-BA | AA | ACMO | TMPTA | | | | | | | |
| Ex. 4 | PET 75 μm | GI1000 36 | XDI 4 | 21 | 30 | 9 | 2 | 0.6 | 100 | 30 | 3 | 6 | 0 | 12 | 5.6 |
| C. Ex. 1 | PET 75 μm | PTMG650 35 | XDI 15 | 10 | 25 | 15 | | 3 | 100 | 30 | 4 | 7 | 0 | 25 | 3.2 |
| C. Ex. 2 | PET 75 μm | PP2000 50 | XDI 10 | 10 | 20 | 10 | | 0.1 | 100 | 30 | 3 | 6 | 0 | 30 | 3.6 |
| C. Ex. 3 | PET 75 μm | | | 90 | | 10 | | 0.1 | 100 | 30 | 6 | 10 | 1 | 12 | 3.6 |

*Isocyanate

TABLE 2

| | Outer most layer | Intermediate layer | | | | | | | Pressure-sensitive adhesive layer Thickness (μm) | Evaluation | | | | |
|---|---|---|---|---|---|---|---|---|---|---|---|---|---|---|---|
| | | Urethane (Part) | | Acrylic (Part) | | | | | Thickness (μm) | | Curl (mm) | Bend (mm) | Crack (Number) | Contamination ΔC | Anchoring power N/20 mm |
| | | Polyol | I* | BA | t-BA | AA | Urethane acrylate | TMPTA | | | | | | | |
| Ex. 5 | PET 75 μm | GI1000 45 | XDI 5 | 15 | 25 | 10 | 1 | | 100 | 30 | 4 | 7 | 0 | 12 | 4.8 |
| Ex. 6 | PET 75 μm | GI1000 45 | XDI 5 | 15 | 25 | 10 | 10 | | 100 | 30 | 3 | 5 | 0 | 11 | 5.8 |
| Ex. 7 | PET 75 μm | GI2000 46 | XDI 4 | 15 | 25 | 10 | 10 | | 100 | 30 | 4 | 6 | 0 | 11 | 5.2 |
| Ex. 8 | PET 75 μm | GI1000 45 | XDI 5 | 15 | 25 | 10 | 0.5 | | 100 | 30 | 4 | 7 | 0 | 11 | 3.2 |
| Ex. 9 | PET 75 μm | GI1000 45 | XDI 5 | 15 | 25 | 10 | 25 | | 100 | 30 | 3 | 5 | 2 | 12 | 6.1 |
| Ex. 10 | PET 75 μm | GI1000 45 | XDI 5 | 15 | 25 | 10 | | 1 | 100 | 30 | 3 | 6 | 0 | 13 | 3.0 |
| Ex. 11 | PET 75 μm | GI1000 45 | XDI 5 | 15 | 25 | 10 | | 10 | 100 | 30 | 2 | 5 | 2 | 12 | 2.5 |

*Isocyanate

Tables 1 and 2 indicate that wafers processed as affixed to the pressure-sensitive adhesive sheets prepared using the multilayer sheets of Examples 1 to 11 according to the present invention showed curls of 5 mm or less and bends of less than 10 mm, so that no problems occurred when transported to the subsequent steps. When wafers were polished to the thickness of 50 μm by using the pressure-sensitive adhesive sheets prepared using the multiplayer sheets of Examples 1 to 8 and 10, the wafers are not damaged. Further, the pressure-sensitive adhesive sheets of Examples 1 to 4 that were prepared using the acrylic-based polymer copolymerized with a nitrogen-containing monomer in the preparation of the composite film and the pressure-sensitive adhesive sheets of Examples 5 to 9 that were prepared using a bifunctional urethane acrylate exhibited good results in the evaluation of the anchoring power, indicating that no residual adhesives on the adherend such as a wafer. Further, the pressure-sensitive adhesive sheets of Examples 1 to 11 showed less contamination onto wafers, thus indicating that low contamination can be realized therewith. Since low contamination can be realized, they will cause neither wire bonding failure nor breakage of the sealant resin.

Comparative examples 1 and 2, which contained no polyolefin-based diols as the urethane component showed severe contamination onto wafers. The pressure-sensitive adhesive sheet of Comparative Example 3 that had an intermediate layer containing only the acrylic component showed large curl and bend.

The pressure-sensitive adhesive sheets of the present invention can be advantageously used as pressure-sensitive adhesive sheet for use in processing semiconductor wafers that are used when the backside of semiconductor wafers is polished or semiconductor wafers are diced. They do not cause breakage at the interface between the aluminum surface and gold wire in wire bonding performed during the production of semiconductor chips, so that high shear strength can be maintained. Further, making the best of the feature of the low contamination, the pressure-sensitive adhesive sheet of the present invention can be used in a variety of applications in which peeling of the pressure-sensitive adhesive sheet during the use or after the use thereof is involved, for example, as pressure-sensitive adhesive sheet for protecting the surface of articles or for preventing breakage of the articles in the manufacture of high precision processed parts such as semiconductors, circuits, various printed boards, various masks, and lead frames.

According to the present invention, pressure-sensitive adhesive sheets and multilayer sheets suitable for such pressure-sensitive adhesive sheets that can be provided which can prevent breakage of articles, cause substantial curls and can realize low contamination when articles such as semiconductor articles and optical articles are processed. For example, when the pressure-sensitive adhesive sheets are affixed to semiconductor wafers and the semiconductor wafers are polished, the wafers are not damaged. Furthermore, since the curl of the wafers due to the residual stress on the pressure-sensitive adhesive sheet can be minimized with the pressure-sensitive adhesive sheet of the present invention, the wafers can be contained in generally used dedicated cassettes. Moreover, according to the present invention, acceptable laminates can be prepared without solvents such as methyl ethyl ketone (MEK), there will be no environmental pollution.

The invention claimed is:

1. A multilayer sheet comprising a composite film and a first film made of at least one material different from that of the composite film selected from the group consisting of polyester-based resins, polyolefin-based resins, thermoplastic resins and thermosetting resins, wherein the composite film contains a urethane polymer and a vinyl-based polymer as effective components, wherein the urethane polymer is formed from a hydrogenated polybutadienediol and a polyisocyanate.

2. The multilayer sheet according to claim 1, wherein the vinyl-based polymer is an acrylic-based polymer.

3. The multilayer sheet according to claim 2, wherein the acrylic-based polymer is obtained by copolymerizing the acrylic monomer with a nitrogen-containing monomer.

4. The multilayer sheet according to claim 1, wherein the vinyl-based polymer comprises bifunctional urethane acrylate.

5. The multilayer sheet according to claim 4, wherein the bifunctional urethane acrylate is contained in an amount of 1 part by weight or more and 50 parts by weight or less based on 100 parts by weight of the vinyl-based monomer.

6. The multilayer sheet according to claim 1, wherein the composite film is prepared by reacting a polyol with a polyisocyanate in a radical polymerizable monomer to form a urethane polymer to obtain a mixture of the resultant urethane polymer and the radical polymerizable monomer, coating the obtained mixture on a first film, and irradiating radiation to cure the coated mixture.

7. The multilayer sheet according to claim 6, wherein the radical polymerizable monomer is an acrylic-based monomer.

8. The multilayer sheet according to claim 1, wherein the first film made of a material different from that of the composite film is formed on one surface of the composite film and a second film made of a material different or the same as the first film is formed on the other surface of the composite film, wherein the multilayer sheet is a laminate.

9. The multilayer sheet according to claim 1, wherein the vinyl-based polymer is an acrylic-based polymer.

10. The multilayer sheet according to claim 9, wherein the acrylic-based polymer is obtained by copolymerizing the acrylic monomer with a nitrogen-containing monomer.

11. The multilayer sheet according to claim 1, wherein the vinyl-based polymer is an acrylic polymer.

12. The multilayer sheet according to claim 11, wherein the acrylic-based polymer is obtained by copolymerizing the acrylic monomer with a nitrogen-containing monomer.

13. The multilayer sheet according to claim 2, wherein the vinyl-based polymer comprises bifunctional urethane acrylate.

14. A pressure-sensitive adhesive sheet including a multilayer sheet having a pressure-sensitive adhesive layer on one surface thereof, wherein the multilayer sheet includes a composite film having a urethane polymer and a vinyl-based polymer as effective components and a first film made of at least one material different from that of the composite film selected from the group consisting of polyester-based resins, polyolefin-based resins, thermoplastic resins and thermosetting resins, wherein the urethane polymer is prepared from a hydrogenated polybutadienediol and a polyisocyanate.

* * * * *